United States Patent
Ma et al.

(10) Patent No.: US 7,443,892 B2
(45) Date of Patent: Oct. 28, 2008

(54) WAVELENGTH CONVERSION LASER APPARATUS

(75) Inventors: Byung Jin Ma, Gyunggi-do (KR); Kiyoyuki Kawai, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 11/808,812

(22) Filed: Jun. 13, 2007

(65) Prior Publication Data
US 2008/0037599 A1 Feb. 14, 2008

(30) Foreign Application Priority Data
Aug. 9, 2006 (KR) .................. 10-2006-0075406

(51) Int. Cl.
*H01S 3/10* (2006.01)
(52) U.S. Cl. .......................... 372/21; 372/22
(58) Field of Classification Search .......... 372/14, 372/21, 22
See application file for complete search history.

(56) References Cited

U.S. PATENT DOCUMENTS 6,590,915 B1 7/2003 Kitaoka et al.
6,614,584 B1 9/2003 Govorkov et al.

FOREIGN PATENT DOCUMENTS

| JP | 7-313396 | 11/1995 |
|----|----------|---------|
| JP | 2003-174222 A | 6/2003 |

*Primary Examiner*—Armando Rodriguez
(74) *Attorney, Agent, or Firm*—McDermott Will & Emery LLP

(57) ABSTRACT

In a wavelength conversion laser device, a laser light source emits first wavelength light. A non-linear optical crystal converts the first wavelength light into second wavelength light. A rotational driver rotates the non-linear optical crystal so as to alter an incidence angle of the first wavelength light with respect to the non-linear optical crystal. A rotational driving controller detects a portion of an output of the second wavelength light, generates a rotational control signal of the non-linear optical crystal in accordance with a change in the output, and transmits the rotational control signal to the rotational driver. A beam location maintaining mirror retroreflects the second wavelength light, outputted from the non-linear optical crystal, along a substantially same path as that of the first wavelength light. Also, an output beam distributor guides the retroreflected second wavelength light in a desired output direction.

7 Claims, 3 Drawing Sheets

WAVELENGTH CONVERSION LASER APPARATUS

CLAIM OF PRIORITY

This application claims the benefit of Korean Patent Application No. 2006-75406 filed on Aug. 9, 2006 in the Korean Intellectual Property Office, the disclosure of which is incorporated herein by reference.

BACKGROUND OF THE INVENTION

1. Field of the Invention

The present invention relates to a wavelength conversion laser device, more particularly, which has a non-linear crystal for generating a second harmonic wave and is configured to rotate the non-linear crystal for phase-matching with a fundamental wave.

2. Description of the Related Art

Recently, there has been a rising demand for a semiconductor laser in various displays and optical recording devices. Especially, the semiconductor laser has found broader applications in the displays to implement full color.

This has considerably called for a laser consuming lower power but having high output in a visible ray region.

In order to obtain red light, an AlGaInP- or AlGaAs-based semiconductor laser has been employed with relative ease. However, to produce green light or blue light, a group III semiconductor is very difficult to grow compared to other semiconductor materials due to unique lattice constant and thermal coefficient thereof. The group III semiconductor is very high in crystal defects such as dislocation, thereby undermining reliability of the laser and shortening lifetime thereof.

To overcome this problem, methods for converting a wavelength through non-linear characteristics have been proposed. In one of the methods, a diode-pumped solid-state (DPSS) laser has been adopted, drawing attention. For example, light from a pump laser diode with a wavelength of 808 nm is made to enter a crystal such as Nd:YAG to obtain a wavelength of around 1,060 nm. Then a frequency of the light is doubled using the non-linear crystal, thereby producing green light with a wavelength around 530 nm.

In the case of the DPSS laser device, the non-linear optical crystal such as a second harmonic generation crystal exhibits a temperature-induced change in refractivity according to a crystal orientation. Accordingly, temperature alters an incidence angle for phase-matching, i.e., optimum wavelength conversion efficiency. This has called for a method for maintaining the wavelength conversion efficiency of the non-linear optical crystal within a temperature range.

Conventional methods involve a thermo-electric cooler (TEC) using a Peltier device and a heat radiating structure. This, however, increases power consumption or the size of the system. To overcome this drawback, U.S. Pat. No. 6,614,584 by Sergei et al. discloses a method for displacing the non-linear optical crystal to have an incidence angle meeting optimum phase-match conditions by monitoring the output of light and feeding it back.

FIG. 1 is a schematic view illustrating a wavelength conversion laser device proposed in the document.

The wavelength conversion laser device 10 shown in FIG. 1 includes a laser optical source 1 and a non-linear optical crystal 5 for converting wavelength light of the laser light source 1 into desired wavelength light.

In the wavelength conversion laser device 10, a portion of an output of the wavelength light propagates to a second beam distributor 2b by a first beam distributor 2a. The second beam distributor 2b splits the light into horizontal and vertical components. Here, the split wavelength components can be transferred to the first and second location detectors 7a and 7b through a spectral filter 4. The first and second location detectors 7a and 7b detect phase mismatch of the light transferred and in turn, a controller 8 causes a displacement Y to the non-linear optical crystal 5 through a rotator in order to have an incidence angle for obtaining optimal output conditions.

As described above, the wavelength conversion laser device 10 shown in FIG. 1 monitors the output of light converted by the non-linear optical crystal 5, and feeds back a phase mismatch degree resulting from the present conditions, e.g., temperature. Then the wavelength conversion laser device 10 mechanically causes a displacement to the optical crystal 5, thereby maintaining maximum optical conversion efficiency.

However, in the wavelength conversion laser device 10, a final output position is changed according to the displacement $\gamma$ of the non-linear optical crystal 5. More specifically, as shown in FIG. 1, when the non-linear optical crystal 5 is displaced (indicated with a dotted line), the exiting position of light is displaced by $\Delta\alpha$ from OUT1 to OUT2.

The displacement in the exiting position degrades precision of the device, rendering it hard to configure an optical system using output light. Especially, this proves very serious for a miniaturized product such as a mobile projector which has gained attention as an application for the laser device. Furthermore, an exiting position adjusting structure needs to be simply configured without adopting a complicated optical system to meet requirements for the miniaturized product.

SUMMARY OF THE INVENTION

The present invention has been made to solve the foregoing problems of the prior art and therefore an aspect of the present invention is to provide a more simplified wavelength conversion laser device which can maintain a light exiting position constant despite displacement in a non-linear optical crystal for phase-matching conditions.

According to an aspect of the invention, the wavelength conversion laser device includes a laser light source for emitting first wavelength light; a non-linear optical crystal for converting the first wavelength light into second wavelength light; a rotational driver for rotating the non-linear optical crystal so as to alter an incidence angle of the first wavelength light with respect to the non-linear optical crystal; a rotational driving controller for detecting a portion of an output of the second wavelength light, generating a rotational control signal of the non-linear optical crystal in accordance with a change in the output, and transmitting the rotational control signal to the rotational driver; a beam location maintaining mirror for retroreflecting the second wavelength light, outputted from the non-linear optical crystal, along a substantially same path as that of the first wavelength light which travels from the laser light source to the non-linear optical crystal; and an output beam distributor disposed between the laser light source and the non-linear optical crystal to guide the retroreflected second wavelength light in a desired output direction.

According to an embodiment of the invention, the non-linear optical crystal rotational driver includes an electronic controller for driving the rotational driver in accordance with the change in the output of the second wavelength light from the non-linear optical crystal so that the second wavelength light of the non-linear optical crystal is phase-matched with the first wavelength light; and a beam distributor for sampling a portion of the light outputted from the non-linear optical crystal to provide to the electronic controller.

Here, the electronic controller includes an output monitor for detecting the change in the output of the second wavelength light; a driving controller for generating a rotational control signal corresponding to a change in the incidence angle of the first wavelength light on the non-linear optical crystal in accordance with the change in the output of the second wavelength light so that the second wavelength light is phase-matched with the first wavelength light, and transmitting the rotational control signal to the rotational driver.

Also, the monitor beam distributor may be disposed on an output path provided by the output beam distributor, but the invention is not limited thereto.

Optionally, the rotational driving controller includes a spectral filter disposed between the electronic controller and the monitor beam distributor, the spectral filter selectively splitting the second wavelength light and providing the split second wavelength to the electronic controller. Alternatively, in a case where the monitor beam distributor is disposed on an output path provided by the output beam distributor, the output beam distributor may selectively split only the second wavelength light to propagate in the desired output path, thereby not requiring the spectral filter.

Preferably, the beam location maintaining mirror has a high reflectivity for the first wavelength light, and the output beam distributor has no reflectivity for the first wavelength light, whereby the beam location maintaining mirror and the output beam distributor cooperate with a mirror disposed at an edge of the laser light source to provide an external resonator for the first wavelength light. This as a result maintains the light exiting position constant and increases wavelength conversion efficiency.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
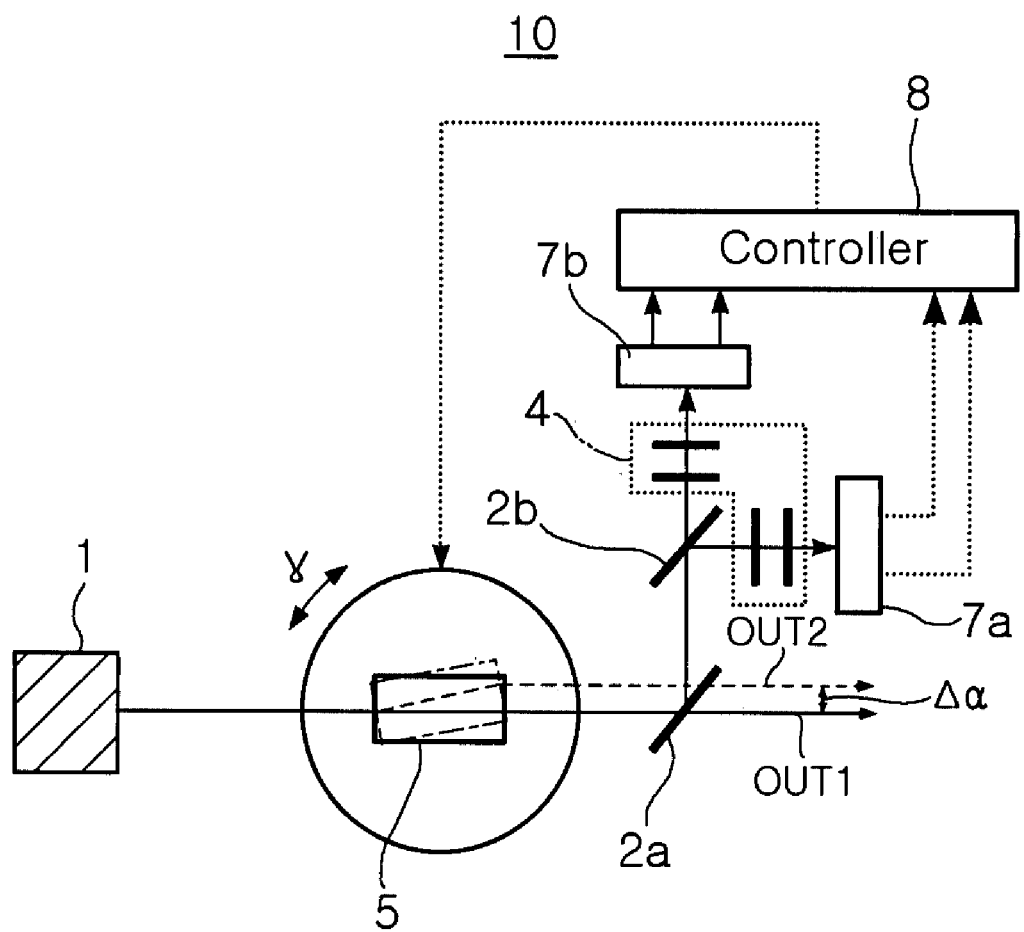
FIG. 1 is a schematic configuration view illustrating a conventional wavelength conversion laser device.
Figure 2:
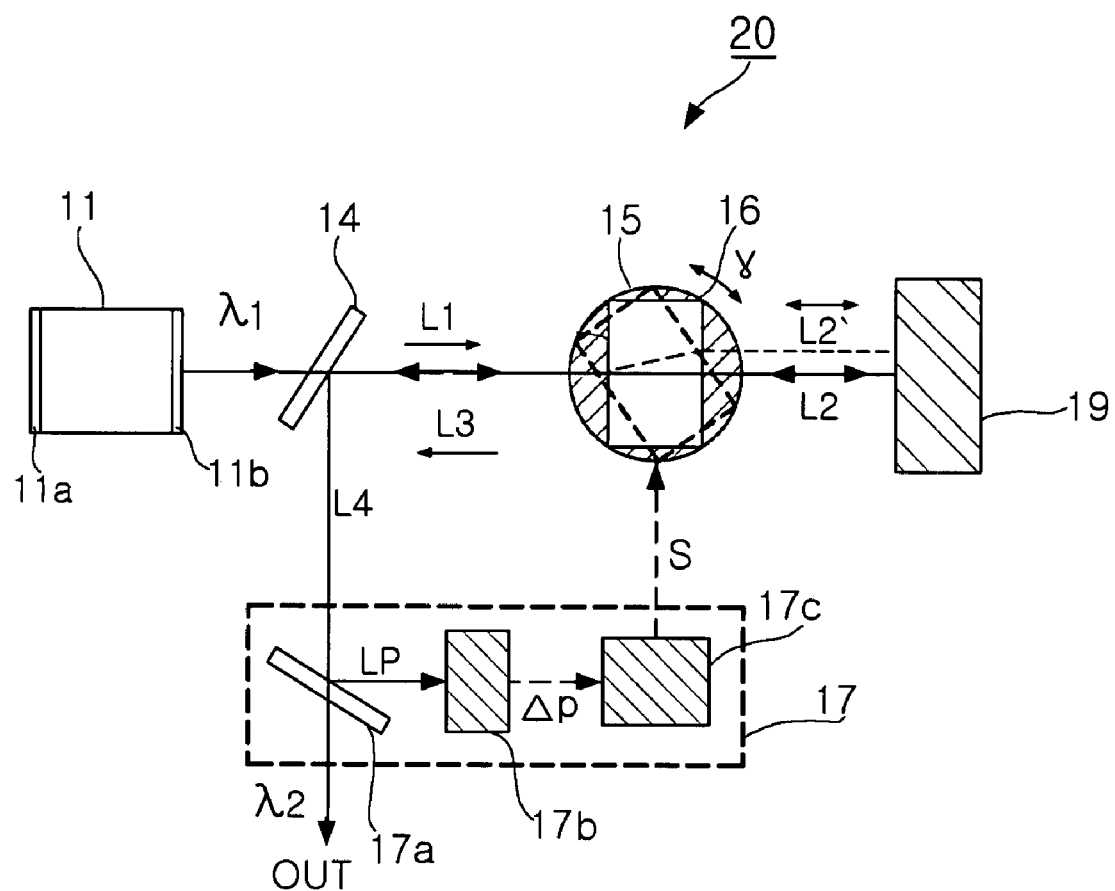
FIG. 2 is a schematic configuration view illustrating a wavelength conversion laser device according to a preferred embodiment of the invention.

FIG. 2 is a schematic configuration view illustrating a wavelength conversion laser device according to a preferred embodiment of the invention.

The wavelength conversion laser device 20 shown in FIG. 2 includes a laser light source 11 for emitting first wavelength light $\lambda_1$ 11 and a non-linear optical crystal 15 for converting the first wavelength light $\lambda_1$ into second wavelength light $\lambda_2$. The non-linear optical crystal 15 is disposed in a rotational driver 16 to adjust an incidence angle of the first wavelength light $\lambda_1$. Thus, the non-crystal optical crystal 15 can be rotated by the rotational driver 16, under optimal phase-match conditions despite a change in temperature due to the rotational driver.

A rotational controller 17 monitors a change in an output (wavelength conversion efficiency) of the second wavelength light $\lambda_2$ according to the change in temperature and controls the rotational driver so as to maintain the non-linear optical crystal 15 in a phase-matched condition.

As shown in FIG. 2, the rotational driving controller 17 includes a monitor beam distributor 17a, an output monitor 17b and a driving controller 17c. The monitor beam distributor 17a samples a portion Lp of the light outputted from the non-linear optical crystal 15. The output monitor 17b detects the change $\Delta p$ in the output of the second wavelength light. The driving controller 17c generates a rotational control signal S for phase-matching in accordance with the change $\Delta p$ in the output detected and transmits the rotational control signal S to the rotational driver 16. Here, the output monitor 17b and the driving controller 17c can be configured as a single electronic controller.

The rotational control signal S transmitted from the driving controller 17c is the result of an operation based on the change $\Delta p$ in the output of the second wavelength light. The rotational control signal S is associated with a change $\gamma$ in the incidence angle of the non-linear optical crystal 15 which is required for phase-matching. In response to the rotational control signal S, the rotational driver 16 rotates the non-linear optical crystal 15 at an appropriate angle for phase-matching, thereby maintaining optimal wavelength conversion efficiency even with the change in temperature.

Also, the wavelength conversion laser device 20 according to the invention includes a beam location maintaining mirror 19 disposed at an output side of the non-linear optical crystal 15 and an output beam distributor 14 disposed between the laser light source 11 and the non-linear optical crystal 15.

The beam location maintaining mirror 19 retroreflects the second wavelength light outputted from the non-linear optical crystal 15 along a substantially same path as that of the first wavelength light. The beam location maintaining mirror 19 is disposed with a reflective surface thereof being substantially perpendicular to an arbitrary exiting path of light.

Therefore, in this phase matching, a previous light exiting position L2 may be displaced to another exiting position L2' according to the change in the incidence angle of the first wavelength light $\lambda_1$ with respect to the non-linear optical crystal 15. However, the second wavelength light is reflected on the non-linear optical crystal 15 by the beam location maintaining mirror 19. Then the second wavelength light is reteroreflected along a substantially the same path L3 as that L1 of the first wave.

The second wavelength light $\lambda_2$ which is reflected by the beam location maintaining mirror 19 and retroreflected by the non-linear optical crystal 19 can propagate in a desired output direction by the output beam distributor 14.

As described above, the second wavelength light propagating primarily through the non-linear optical crystal 15 toward the mirror 19 may have different exiting positions L2 and L2' depending on the incidence angle altered by the phase-matching conditions. But the second wavelength light is reflected secondarily through the non-linear optical crystal 15 by the beam location maintaining mirror 19 and then retroreflected along a substantially same path L3 as that L1 of the first wavelength light. Therefore, the second wavelength light reaching the output beam distributor 14 has substantially the same light exiting position. The output beam distributor 14 just re-directs the light in a desired output path L4, thereby maintaining an output position OUT of the laser device constant.

As described above, in the output structure shown in FIG. 2, the second wavelength light can be outputted after passing through the non-linear crystal 15 twice or in a larger even number. In a case where the second wavelength light passes through the non-linear crystal 15 once or in a larger odd number, the second wavelength light is altered in the exiting path L2'. However, here, the second wavelength light is refracted again by the non-linear optical crystal 15 at least once, thereby maintaining the final exiting path L4 substantially constant.

In this exemplary embodiment, the monitor beam distributor 17a is disposed on the final output path L4. However, in a case the monitor beam distributor 17a is disposed on a path of the second wavelength light which propagates through the non-crystal optical crystal at least once, the monitor beam distributor 17a can be disposed on other arbitrary locations, e.g., L2 and L3. Also, optionally, a spectral filter (not illustrated) can be additionally disposed at an input side of the light output monitor 17b. Preferably, the spectral filter may be disposed between the monitor beam distributor 17a and the light output monitor 17b. However, according to the invention, the output beam distributor 14 can be configured to selectively split only the second wavelength light, thereby eliminating a need for the spectral filter.

Moreover, a method for maintaining the light exiting position according to the invention enhances wavelength conversion efficiency.

More specifically, as shown in FIG. 2, the beam location maintaining mirror has a high reflectivity for the first wavelength light and the second wavelength light. Also, the output beam distributor 14 has no reflectivity for the first wavelength light, thereby functioning as an external resonator for the first wavelength light. For example, the laser source 11 includes a first mirror 11b disposed at an exiting side and a second mirror 11a disposed at an opposing side thereof. In general, the second mirror 11a has higher reflectivity for the first wavelength light and the first mirror 11b has no reflectivity. Therefore, the beam location maintaining mirror 19 cooperates with the second mirror 11a to provide an external resonator for the first wavelength light.

The invention allows the light exiting position to be maintained constant, and additionally, this resonator structure significantly boosts conversion efficiency of the second wavelength light.

Figure 3:
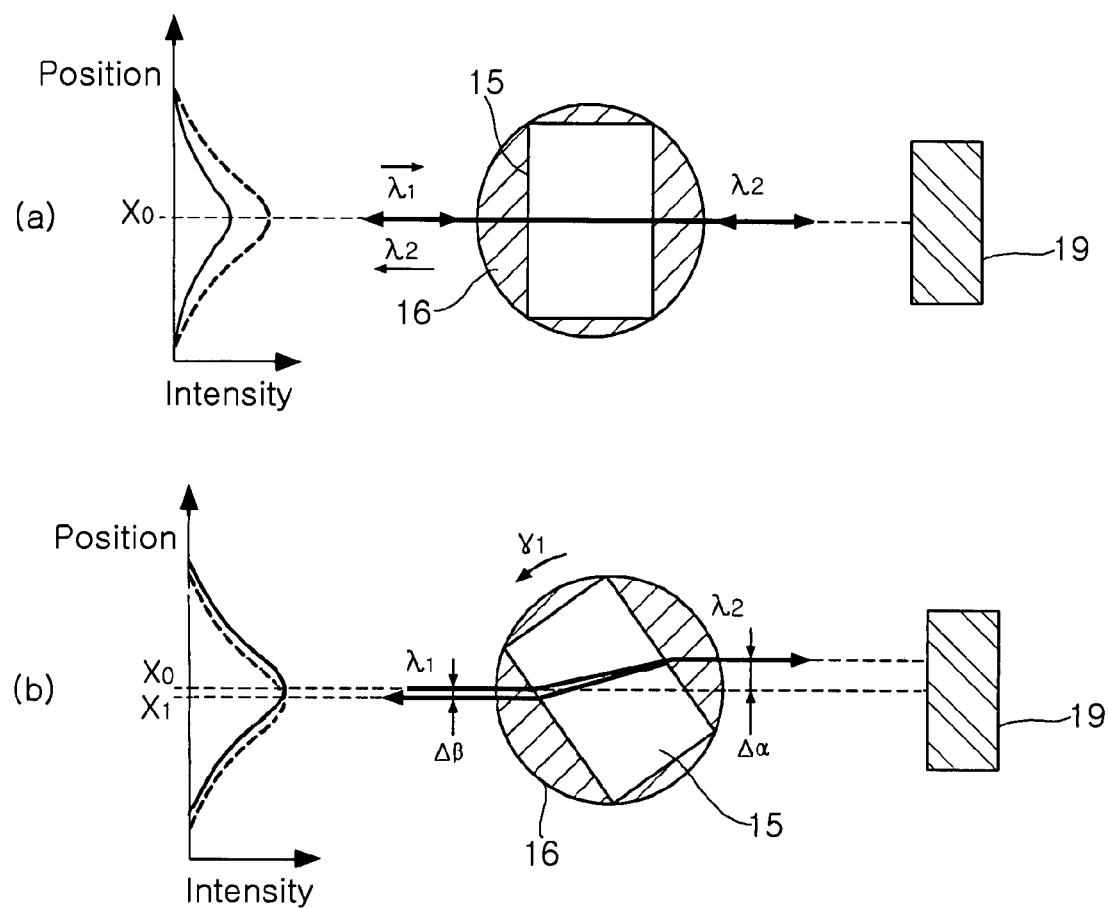
FIGS. 3a and 3b are schematic views for explaining an adjustment of a light exiting position in a phase-matching process in the wavelength conversion laser device shown in FIG. 2.

FIGS. 3a and 3b are schematic views for explaining more easily a process of maintaining a light exiting position in accordance with phase-matching in a wavelength conversion laser device.

FIG. 3a illustrates a phase-mismatch in accordance with a change in temperature. That is, when it is assumed that a non-linear optical crystal 15 is located at an initial position for maximizing efficiency of conversion into second wavelength light (indicated with a dotted line), refractivity of the non-linear optical crystal 15 is altered in accordance with a crystal orientation due to a change in temperature so that the second wavelength light is lowered in its conversion efficiency.

In this phase-mismatch condition, as shown in FIG. 3b, the non-linear optical crystal is rotated at a predetermined angle to adjust an incidence angle of the first wavelength light, thereby obtaining the maximum conversion efficiency. Here, a beam passing primarily through the non-linear optical crystal 15 is displaced by $\Delta\alpha$ in an exiting position due to rotation of the non-crystal optical crystal 15.

However, the beam is reflected by the beam location maintaining mirror 19 and propagates secondarily through the non-linear optical crystal 15 to be refracted. Thus, the beam can be retroreflected along a substantially same path as an incidence path.

In fact, as shown, the second beam has a wavelength $\lambda_2$ different from a wavelength $\lambda_1$ of the first beam, thus entailing moderate difference $\Delta\beta$ in the path due to a difference in refractivity in accordance with the wavelength. However, this difference $\Delta\beta$ is very small compared with the difference $\Delta\alpha$ in the path resulting from an incidence angle which is altered by phase-matching. This brings about significantly less change in the exiting position.

Moreover, the beam location maintaining structure of the invention can be implemented through a simple structure using a mirror, thereby well-suited for miniaturization.

As set forth above, according to exemplary embodiments of the invention, when a beam is changed in its exiting position resulting from the displacement of a non-linear optical crystal during phase-matching, the beam is refracted secondarily by the non-linear optical crystal through a mirror. This produces a wavelength conversion laser device which maintains the exiting position substantially constant. Especially, a beam location maintaining means can be realized through a simple structure using a mirror, thereby leading to miniaturization. Moreover, the beam location maintaining means provides a resonator structure for the first wavelength light, thereby noticeably increasing conversion efficiency thereof.

While the present invention has been shown and described in connection with the preferred embodiments, it will be apparent to those skilled in the art that modifications and variations can be made without departing from the spirit and scope of the invention as defined by the appended claims.

What is claimed is:

1. A wavelength conversion laser device comprising:
    a laser light source for emitting first wavelength light;
    a non-linear optical crystal for converting the first wavelength light into second wavelength light;
    a rotational driver for rotating the non-linear optical crystal so as to alter an incidence angle of the first wavelength light with respect to the non-linear optical crystal;
    a rotational driving controller for detecting a portion of an output of the second wavelength light, generating a rotational control signal of the non-linear optical crystal in accordance with a change in the output, and transmitting the rotational control signal to the rotational driver;
    a beam location maintaining mirror for retroreflecting the second wavelength light, outputted from the non-linear optical crystal, along a substantially same path as that of the first wavelength light which travels from the laser light source to the non-linear optical crystal; and
    an output beam distributor disposed between the laser light source and the non-linear optical crystal to guide the retroreflected second wavelength light in a desired output direction.

2. The wavelength conversion laser device according to claim 1, wherein the non-linear optical crystal rotational driver comprises:
    an electronic controller for driving the rotational driver in accordance with the change in the output of the second wavelength light from the non-linear optical crystal so that the second wavelength light of the non-linear optical crystal is phase-matched with the first wavelength light; and
    a monitor beam distributor for sampling a portion of the light outputted from the non-linear optical crystal to provide to the electronic controller.

3. The wavelength conversion laser device according to claim 2, wherein the electronic controller comprises:
   an output monitor for detecting the change in the output of the second wavelength light;
   a driving controller for generating a rotational control signal corresponding to a change in the incidence angle of the first wavelength light on the non-linear optical crystal in accordance with the change in the output of the second wavelength light so that the second wavelength light is phase-matched with the first wavelength light, and transmitting the rotational control signal to the rotational driver.

4. The wavelength conversion laser device according to claim 2, wherein the monitor beam distributor is disposed on an output path provided by the output beam distributor.

5. The wavelength conversion laser device according to claim 2, wherein the rotational driving controller comprises a spectral filter disposed between the electronic controller and the monitor beam distributor, the spectral filter selectively splitting the second wavelength light and providing the split second wavelength to the electronic controller.

6. The wavelength conversion laser device according to claim 1, wherein the output beam distributor selectively splits only the second wavelength light to propagate in the desired output path.

7. The wavelength conversion laser device according to claim 1, wherein the beam location maintaining mirror has a high reflectivity for the first wavelength light, and the output beam distributor has no reflectivity for the first wavelength light,
   whereby the beam location maintaining mirror and the output beam distributor cooperate with a mirror disposed at an edge of the laser light source to provide an external resonator for the first wavelength light.

* * * * *